(12) United States Patent
Lin et al.

(10) Patent No.: US 10,333,256 B2
(45) Date of Patent: Jun. 25, 2019

(54) ELECTRICAL CONNECTOR ASSEMBLY

(71) Applicant: LOTES CO., LTD, Keelung (TW)

(72) Inventors: Chin Chi Lin, Keelung (TW); Cheng Wei Lo, Keelung (TW)

(73) Assignee: LOTES CO., LTD, Keelung (TW)

( * ) Notice: Subject to any disclaimer, the term of this patent is extended or adjusted under 35 U.S.C. 154(b) by 0 days.

(21) Appl. No.: 15/892,705

(22) Filed: Feb. 9, 2018

(65) Prior Publication Data

US 2018/0233848 A1 Aug. 16, 2018

Related U.S. Application Data

(60) Provisional application No. 62/459,756, filed on Feb. 16, 2017.

(30) Foreign Application Priority Data

Jan. 11, 2018 (CN) .......................... 2018 1 0025903

(51) Int. Cl.
*H01R 9/03* (2006.01)
*H01R 13/6591* (2011.01)
(Continued)

(52) U.S. Cl.
CPC ....... *H01R 13/6591* (2013.01); *H01L 23/367* (2013.01); *H01L 23/3675* (2013.01);
(Continued)

(58) Field of Classification Search
CPC .... H01R 13/6591; H01R 12/53; H01R 12/57; H01R 12/716; H01R 12/725;
(Continued)

(56) References Cited

U.S. PATENT DOCUMENTS 6,210,014 B1 * 4/2001 Kubizne ................ F21S 45/37
362/96
9,843,128 B2 * 12/2017 Tsai .................... H01R 13/5202
(Continued)

FOREIGN PATENT DOCUMENTS

| CN | 203104991 U | 7/2013 |
| CN | 204014309 U | 12/2014 |
| CN | 205846310 U | 12/2016 |

*Primary Examiner* — Khiem M Nguyen
(74) *Attorney, Agent, or Firm* — Locke Lord LLP; Tim Tingkang Xia, Esq.

(57) ABSTRACT

An electrical connector assembly includes: a circuit board, provided with at least one chip; an electrical connector, electrically connected to one end of the circuit board, and used to be mated with a mating connector; and a metal shell, covering the circuit board and the electrical connector. The metal shell is provided with at least one through hole running therethrough. Each through hole is provided with a waterproof layer preventing liquid from passing from an exterior of the metal shell to an interior of the metal shell and enabling gas to pass between the interior and the exterior of the metal shell, thereby achieving water proofing and heat dissipation, avoiding malfunctioning of the electrical connector and the chip due to excess temperature or liquid entry, ensuring the reliability of signal transmission between the electrical connector and the chip, and prolonging the service lives of the electrical connector and the chip.

21 Claims, 9 Drawing Sheets

(51) Int. Cl.

| | | |
|---|---|---|
| *H01L 23/367* | (2006.01) | |
| *H01R 12/53* | (2011.01) | |
| *H01R 12/57* | (2011.01) | |
| *H01R 12/71* | (2011.01) | |
| *H01R 12/72* | (2011.01) | |
| *H01R 12/73* | (2011.01) | |
| *H01R 13/405* | (2006.01) | |
| *H01R 13/506* | (2006.01) | |
| *H01R 13/516* | (2006.01) | |
| *H01R 13/52* | (2006.01) | |
| *H01R 13/6581* | (2011.01) | |
| *H01R 13/66* | (2006.01) | |
| *H05K 1/02* | (2006.01) | |
| *H05K 7/20* | (2006.01) | |
| *H01L 23/42* | (2006.01) | |
| *H01R 13/6594* | (2011.01) | |

(52) U.S. Cl.
CPC ............ *H01L 23/42* (2013.01); *H01R 12/53* (2013.01); *H01R 12/57* (2013.01); *H01R 12/716* (2013.01); *H01R 12/725* (2013.01); *H01R 12/732* (2013.01); *H01R 13/405* (2013.01); *H01R 13/506* (2013.01); *H01R 13/516* (2013.01); *H01R 13/5213* (2013.01); *H01R 13/5216* (2013.01); *H01R 13/6581* (2013.01); *H01R 13/665* (2013.01); *H05K 1/0203* (2013.01); *H05K 7/2039* (2013.01); *H05K 7/20154* (2013.01); *H01R 13/6594* (2013.01)

(58) Field of Classification Search
CPC .. H01R 12/732; H01R 13/405; H01R 13/506; H01R 13/516; H01R 13/5213; H01R 13/5216; H01R 13/6581; H01R 13/665; H01L 23/367; H01L 23/3675; H01L 23/42; H05K 1/0203; H05K 7/20154; H05K 7/2039
USPC .................... 439/83, 76.1, 205, 206, 607.41
See application file for complete search history.

(56) References Cited

U.S. PATENT DOCUMENTS

| | | | |
|---|---|---|---|
| 10,020,610 B2* | 7/2018 | Suzuki | ............... H01R 13/5213 |
| 2014/0113497 A1* | 4/2014 | Wang | .................... H01R 13/52 |
| | | | 439/660 |

* cited by examiner

A-A

ELECTRICAL CONNECTOR ASSEMBLY

CROSS-REFERENCE TO RELATED PATENT APPLICATION

This non-provisional application claims priority to and the benefit of, pursuant to 35 U.S.C. § 119(e), U.S. provisional patent application Ser. No. 62/459,756 filed Feb. 16, 2017, and under 35 U.S.C. § 119(a), patent application Serial No. CN201810025903.3 filed in China on Jan. 11, 2018. The disclosures of the above applications are incorporated herein in their entireties by reference.

Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference were individually incorporated by reference.

FIELD

The present invention relates to an electrical connector assembly, and more particularly to an electrical connector assembly having a heat dissipation function and a waterproof function.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

An electrical connector assembly in the related art is used to be mated with a receptacle connector on a motherboard so as to achieve electrical connection. The electrical connector assembly includes a circuit board. An electrical connector is soldered to one end of the circuit board and mated with the receptacle connector, and a cable is soldered to the other end of the circuit board and electrically connected to the electrical connector. The circuit board is also provided with a plurality of chips, and a metal shell houses and is fixed to the electrical connector, the circuit board and the cable.

When the electrical connector is mated with the receptacle connector, the electrical connector and the chip easily generate heat as the chip is influenced by conductor impedance, and the chip is operated more quickly and that power needed for operating the chip is increased. Furthermore, the heat continuously generated by the electrical connector and the chip is accumulated inside the metal shell and cannot be effectively dissipated, thereby affecting the reliability of signal transmission of the electrical connector and the chip by a continuous high temperature, or even resulting in malfunction of the electrical connector and the chip. Moreover, due to the excess temperature of the metal shell, a user will have a strong feeling on temperature when operating or touching the metal shell, thereby causing discomfort of the user, and affecting the usage experience of the user accordingly.

Therefore, a heretofore unaddressed need to design a novel electrical connector assembly exists in the art to address the aforementioned deficiencies and inadequacies.

SUMMARY

In view of the problems addressed in the background technology, an objective of the present invention is to provide an electrical connector assembly which has a good heat dissipation effect and a good waterproof effect and ensures reliable signal transmission.

To achieve the foregoing objective, the present invention adopts the following technical solutions.

An electrical connector assembly includes: a circuit board, provided with at least one chip; an electrical connector, electrically connected to one end of the circuit board, and configured to be mated with a mating connector; and a metal shell, covering the circuit board and the electrical connector, where the metal shell is provided with at least one through hole running therethrough, and each of the at least one through hole is provided with a waterproof layer preventing liquid from passing from an exterior of the metal shell to an interior of the metal shell and enabling gas to pass between the interior and the exterior of the metal shell.

In certain embodiments, the waterproof layer is a mesh structure made of a Gore-Tex material.

In certain embodiments, the waterproof layer is provided at an end of each of the at least one through hole close to the circuit board.

In certain embodiments, a shielding layer is plated on the waterproof layer, and the shielding layer enables the gas to pass between the interior and the exterior of the metal shell.

In certain embodiments, none of the at least one through hole is provided on the metal shell at a position right above each of the at least one chip.

In certain embodiments, a thermally conductive sheet is provided between the metal shell and the at least one chip, and the at least one chip is thermally conducted with the metal shell via the thermally conductive sheet.

In certain embodiments, the metal shell is provided with one of the at least one through hole at a position right above the electrical connector.

In certain embodiments, an insulating member is sleeved over a side of the electrical connector close to the circuit board, the metal shell covers the insulating member, and the one of the at least one through hole is provided at a position of the metal shell right above the insulating member.

In certain embodiments, a plastic shell covers the metal shell, the plastic shell is provided with at least one opening running therethrough at a position corresponding to the at least one through hole of the metal shell, and the at least one opening is communicated with the at least one through hole.

In certain embodiments, a cable is provided with a plurality of core wires soldered to an opposite end of the circuit board, an injection-molded member covers the core wires, and the metal shell is provided with one of the at least one through hole at a position right above the injection-molded member.

Compared with the related art, the electrical connector assembly according to certain embodiments of the present invention has the following beneficial effects.

The metal shell is provided with at least one through hole running therethrough, and each of the at least one through hole is provided with a waterproof layer. The waterproof layer enables heat generated by the electrical connector and the chip to be dissipated to an external environment via the through hole for heat exchange with external air, so as to achieve heat dissipation. Moreover, the waterproof layer prevents liquid in the external environment from entering the electrical connector and the chip via the through hole, so as to achieve water proofing, thereby avoiding malfunctioning of the electrical connector and the chip due to excess temperature or liquid entry, ensuring the reliability of signal transmission between the electrical connector and the chip, and prolonging the service lives of the electrical connector and the chip.

To achieve the foregoing objective, the present invention may also adopt the following technical solutions.

An electrical connector assembly includes: a circuit board, provided with at least one chip; an electrical connector, electrically connected to one end of the circuit board, and configured to be mated with a mating connector; and a metal shell, covering the circuit board and the electrical connector, where the metal shell is provided with at least one through hole running therethrough, each of the at least one through hole is provided with a waterproof layer and a shielding layer, the waterproof layer prevents liquid from passing from an exterior of the metal shell to an interior of the metal shell and enables gas to pass between the interior and the exterior of the metal shell, and the shielding layer enables the gas to pass between the interior and the exterior of the metal shell.

In certain embodiments, the waterproof layer is a mesh structure made of a Gore-Tex material.

In certain embodiments, the shielding layer is a mesh structure made of a metal material.

In certain embodiments, the shielding layer is located closer to the circuit board than the waterproof layer.

In certain embodiments, none of the at least one through hole is provided on the metal shell at a position right above each of the at least one chip.

In certain embodiments, a thermally conductive sheet is provided between the metal shell and the at least one chip, and the at least one chip is thermally conducted with the metal shell via the thermally conductive sheet.

In certain embodiments, the metal shell is provided with one of the at least one through hole at a position right above the electrical connector.

In certain embodiments, an insulating member is sleeved over a side of the electrical connector close to the circuit board, the metal shell covers the insulating member, and the one of the at least one through hole is provided at a position of the metal shell right above the insulating member.

In certain embodiments, a plastic shell covers the metal shell, the plastic shell is provided with at least one opening running therethrough at a position corresponding to the at least one through hole of the metal shell, and the at least one opening is communicated with the at least one through hole.

In certain embodiments, a cable is provided with a plurality of core wires soldered to an opposite end of the circuit board, an injection-molded member covers the core wires, and the metal shell is provided with one of the at least one through hole at a position right above the injection-molded member.

Compared with the related art, the electrical connector assembly according to certain embodiments of the present invention also has the following beneficial effects.

The metal shell is provided with at least one through hole running therethrough, and each of the at least one through hole is provided with a waterproof layer and a shielding layer. The waterproof layer has heat dissipation and waterproof functions, thereby avoiding malfunctioning of the electrical connector and the chip due to excess temperature or liquid entry. Moreover, the shielding layer has a heat dissipation function, thereby avoiding malfunctioning of the electrical connector and the chip due to excess temperature. Meanwhile, the shielding layer has the ability to resist electromagnetic interference, thereby enhancing the shielding effect of the metal shell for the electrical connector and the chip, ensuring the reliability of signal transmission between the electrical connector, the circuit board and the chip, and prolonging the service lives of the electrical connector and the chip.

To achieve the foregoing objective, the present invention may also adopt the following technical solutions.

A shell is provided with at least one through hole running therethrough, where each of the at least one through hole is provided with a waterproof layer, and one side of the waterproof layer is provided with a shielding layer being electrically conductive, where the waterproof layer prevents liquid from passing from an exterior of the shell to an interior of the shell and enables gas to pass between the interior and the exterior of the shell, and the shielding layer enables the gas to pass between the interior and the exterior of the shell.

Compared with the related art, the electrical connector assembly according to certain embodiments of the present invention also has the following beneficial effects.

The waterproof layer enables external air to circulate between the interior and the exterior of the shell and prevents liquid in the external environment from entering the shell. The shielding layer allows external air to circulate between the interior and the exterior of the shell, and the shielding layer is electrically conductive to enhance the anti-electromagnetic interference capability of the shell.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment, and wherein.

DETAILED DESCRIPTION

Figure 1:
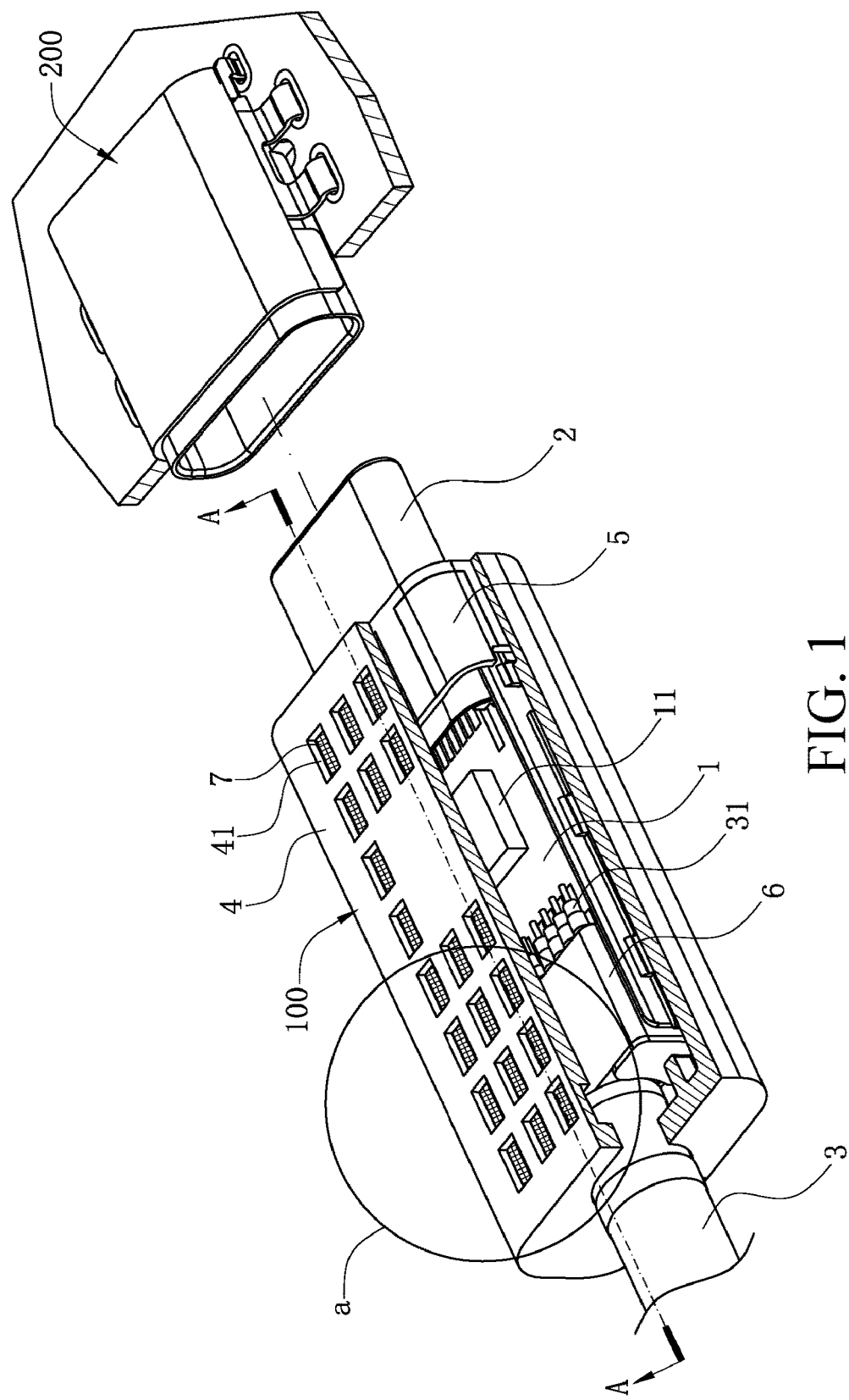
FIG. 1 is a perspective view of an electrical connector assembly and a mating connector according to a first embodiment of the present invention.

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present invention.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the terms "comprising", "including", "carrying", "having", "containing", "involving", and the like are to be understood to be open-ended, i.e., to mean including but not limited to.

The description will be made as to the embodiments of the present invention in conjunction with the accompanying drawings in FIGS. 1-9. In accordance with the purposes of this invention, as embodied and broadly described herein, this invention, in one aspect, relates to an electrical connector assembly.

Figure 2:
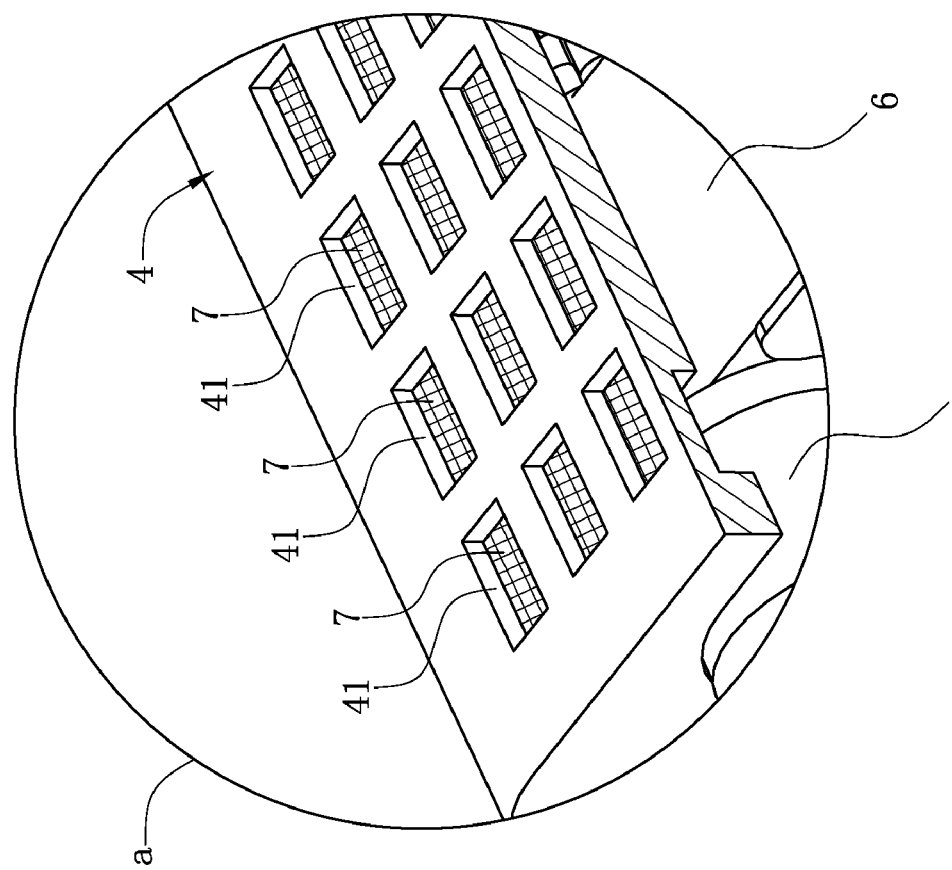
FIG. 2 is an enlarged view of a part a in FIG. 1.

As shown in FIG. 1 and FIG. 2, an electrical connector assembly 100 according to a first embodiment of the present invention includes: a circuit board 1; an electrical connector 2 electrically connected to one end of the circuit board 1, and mated with a mating connector 200 in a front-rear direction; a cable 3, soldered to an opposite end of the circuit board 1, and electrically connected to the electrical connector 2; and a metal shell 4, covering the electrical connector 2, the circuit board 1 and the cable 3.

Figure 3:
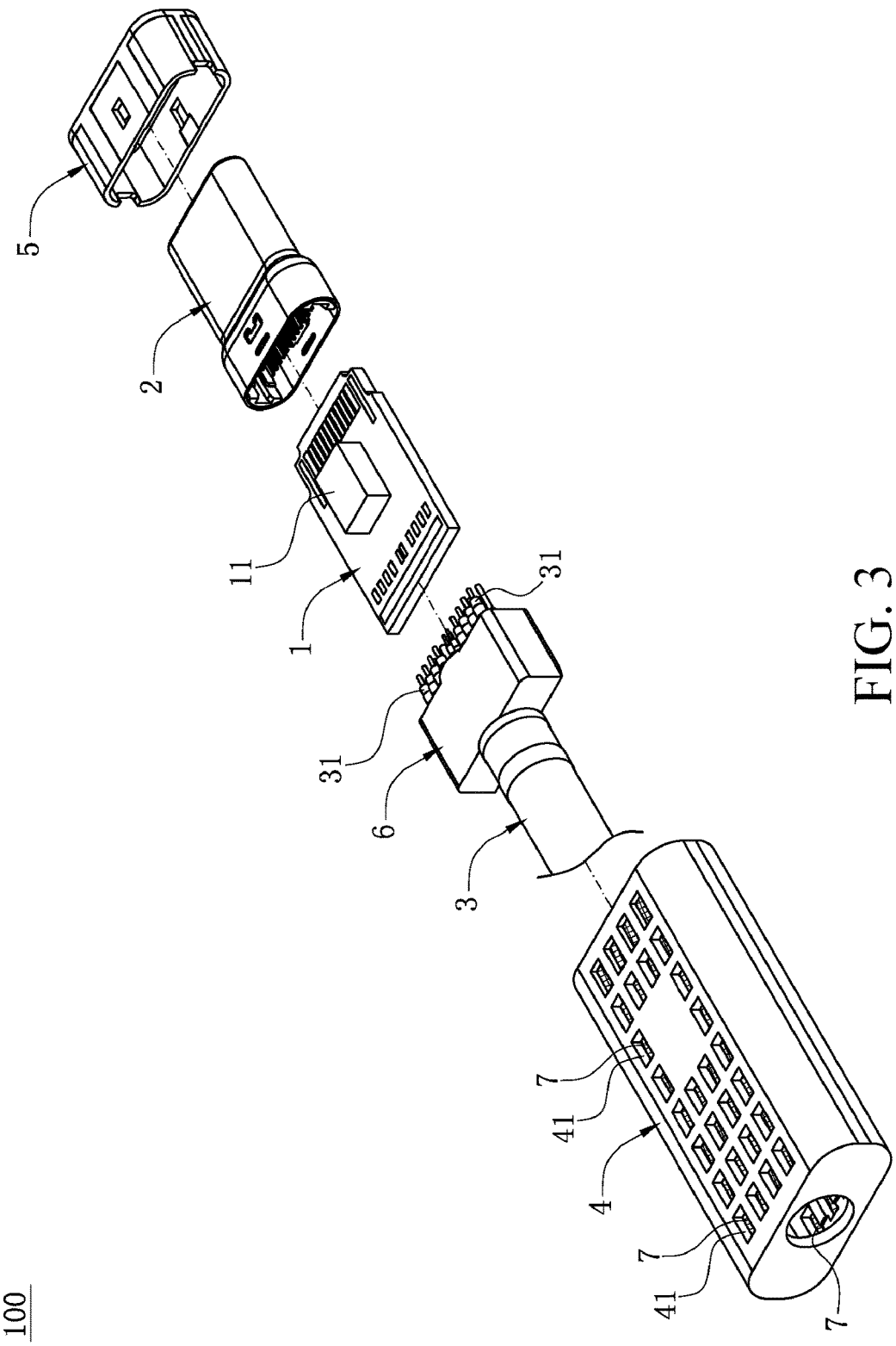
FIG. 3 is a perspective exploded view of an electrical connector assembly in FIG. 1.
Figure 6:
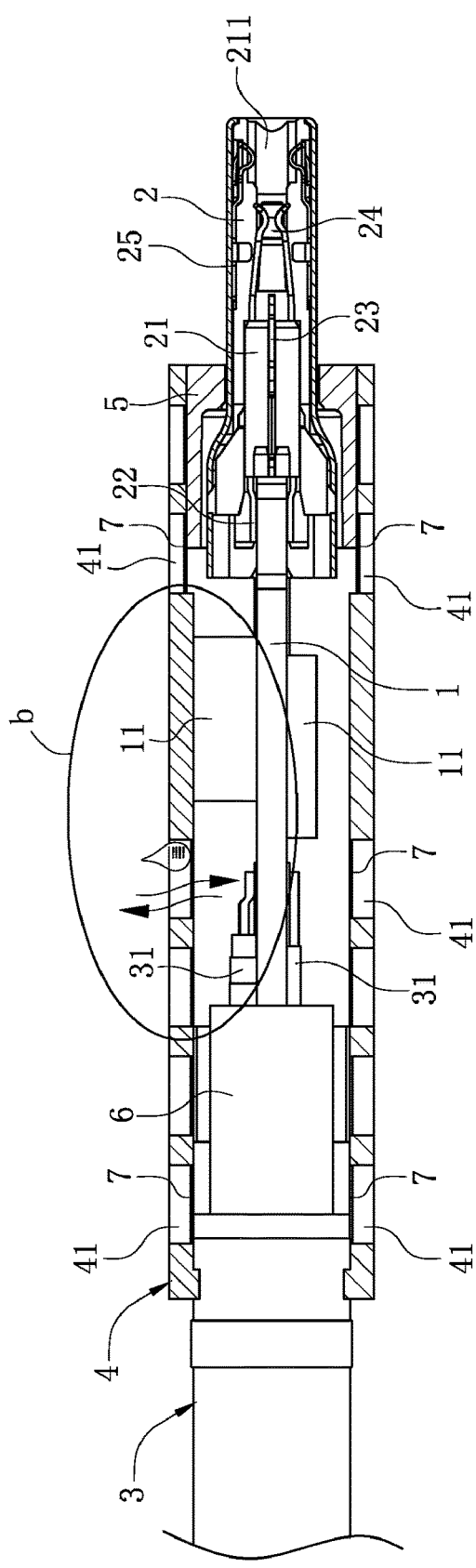
FIG. 6 is a sectional view of an electrical connector assembly in FIG. 1 along an A-A direction.

As shown in FIG. 1, FIG. 3 and FIG. 6, the circuit board 1 is provided with at least one chip 11. In the present embodiment, there are multiple chips 11 disposed on an upper surface and a lower surface of the circuit board 1 respectively. In other embodiments, there may be only one chip 11.

The metal shell 4 covers and is fixed to the circuit board 1, such that the circuit board 1 is accommodated in the metal shell 4 to prevent the circuit board 1 from interference of an external environment.

Figure 5:
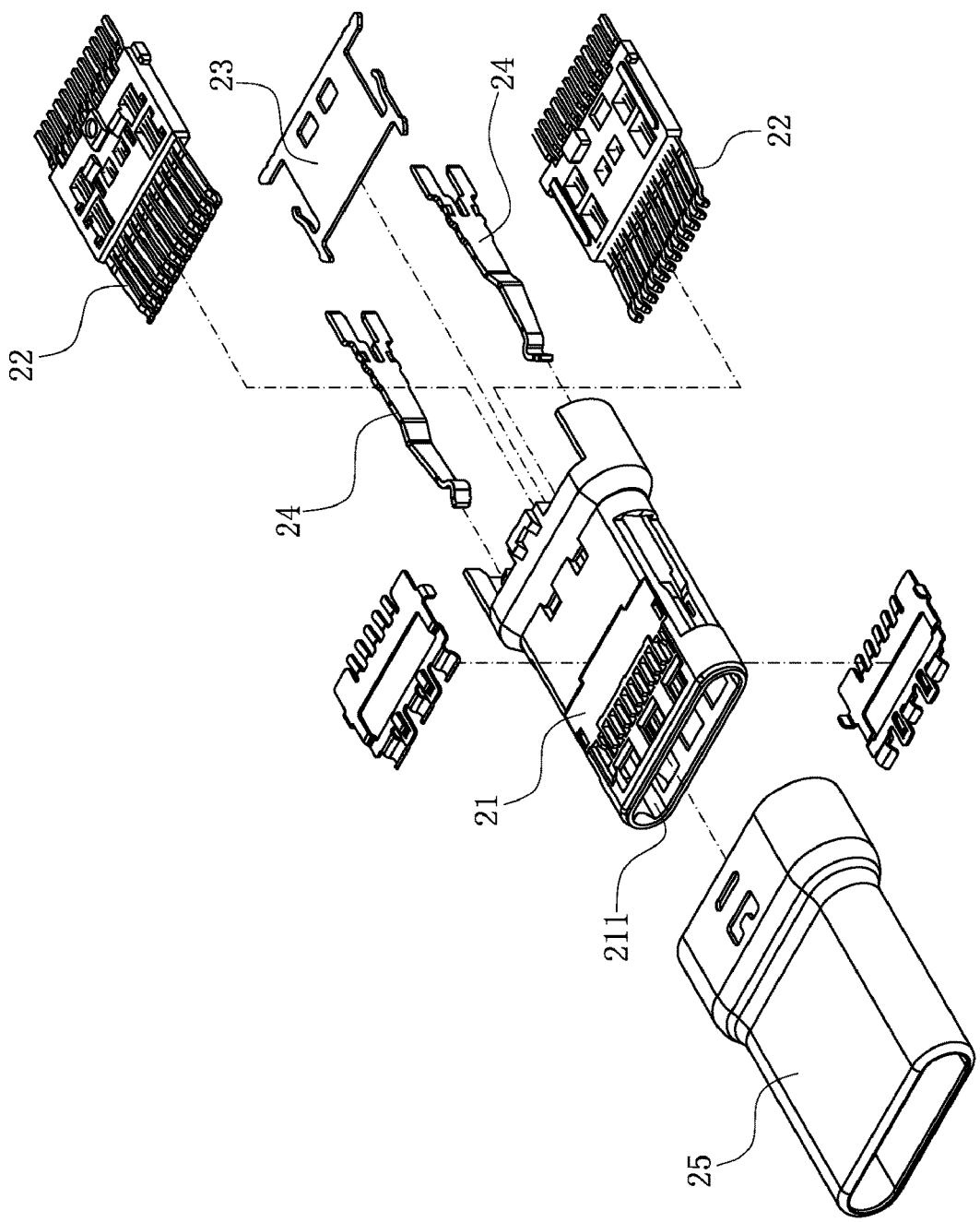
FIG. 5 is a perspective exploded view of an electrical connector in FIG. 4.

As shown in FIG. 5 and FIG. 6, the electrical connector 2 is compatible to the universal serial bus (USB) TYPE C specification, and includes: an insulating body 21, where an insertion cavity 211 is concavely provided at a front end of the insulating body 21 for accommodating the mating connector 200; two rows of conductive terminals 22 soldered to a front end of the circuit board 1, where the two rows of conductive terminals 22 are distributed on upper and lower sides of the insertion cavity 211 respectively and arranged in a central symmetry; a grounding sheet 23 inserted between the two rows of conductive terminals 22; two elastic buckling members 24 accommodated at two sides of the insulating body 21 and extending into the insertion cavity 211, where the elastic buckling members 24 abut the grounding sheet 23; and a shielding shell 25 covering the insulating body 21.

As shown in FIG. 1, FIG. 3 and FIG. 6, an insulating member 5 is sleeved over a rear end of the shielding shell 25, and the metal shell 4 covers and is fixed to the insulating member 5, such that a front end of the electrical connector 2 extends out of the metal shell 4, so as to facilitate mating between the electrical connector 2 and the mating connector 200.

The cable 3 is provided with a plurality of core wires 31, soldered to a rear end of the circuit board 1 and electrically connected to the electrical connector 2, and an injection-molded member 6 covers the core wires 31 to fix the core wires 31.

When the electrical connector 2 is mated with the mating connector 200, the electrical connector 2 easily generates heat in a mating process due to an excess current. Moreover, the chip 11 easily generates heat due to the influence of conductor impedance, thereby increasing the temperature and generating heat. The heat generated by the electrical connector 2 and the chip 11 is accumulated inside the metal shell 4.

Figure 7:
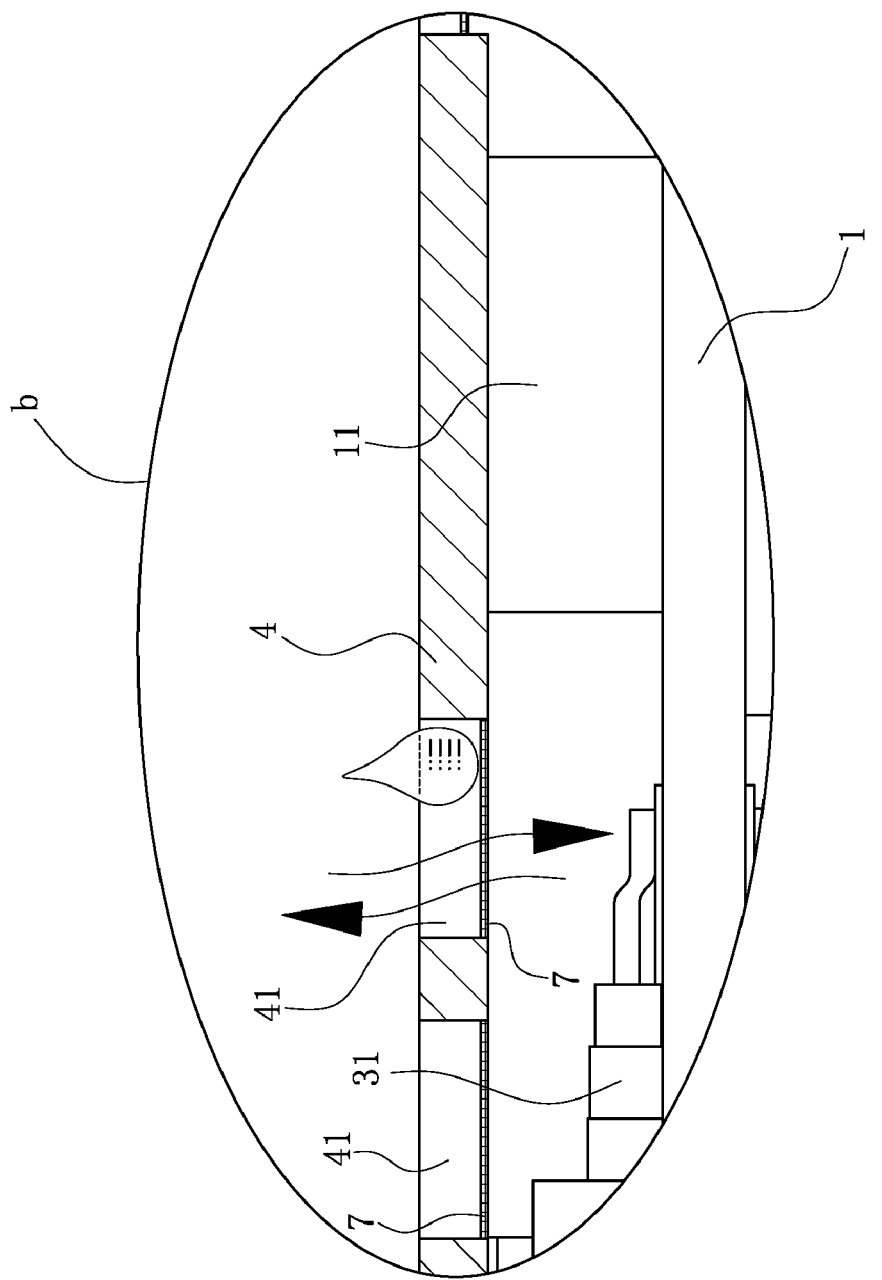
FIG. 7 is an enlarged view of a part b in FIG. 5.

As shown in FIG. 1, FIG. 6 and FIG. 7, the metal shell 4 is provided with at least one through hole 41 running therethrough. The through hole 41 runs through the metal shell 4 in a vertical direction, and the through hole 41 is used for dissipating heat generated by the electrical connector 2 and the chip 11 from the metal shell 4.

In the present embodiment, there are multiple through holes 41 provided on a top wall and a bottom wall of the metal shell 4 (in other embodiments, there may be only one through hole 41), such that the heat generated by the electrical connector 2 and the chip 11 can be fully dissipated from the through holes 41.

None of the through holes 41 is provided on the metal shell 4 at a position right above the chip 11. The bottom wall of the metal shell 4 is in contact with an upper surface of the chip 11, such that a full contact area is provided between the chip 11 and the metal shell 4, thereby ensuring that the heat generated by the chip 11 can be fully conducted to the metal shell 4.

The through holes 41 are provided on the metal shell 4 at positions right above and right below the insulating member 5 and the injection-molded member 6 respectively, such that the heat generated by the electrical connector 2 and the chip 11 can be fully dissipated out via the through holes 41.

Each through hole 41 is provided with a waterproof layer 7. The waterproof layer 7 is a mesh structure made of a Gore-Tex material, and the waterproof layer 7 is disposed at an end of the through hole 41 close to the circuit board 1. In other embodiments, the waterproof layer 7 may also be attached to the inner side of the metal shell 4 and may cover the through hole 41, or each through hole 41 may also be provided with a plurality of waterproof layers 7. The waterproof layer 7 prevents liquid from passing from the exterior of the metal shell 4 to the interior of the metal shell 4, and enables gas to pass between the interior and the exterior of the metal shell 4.

Figure 4:
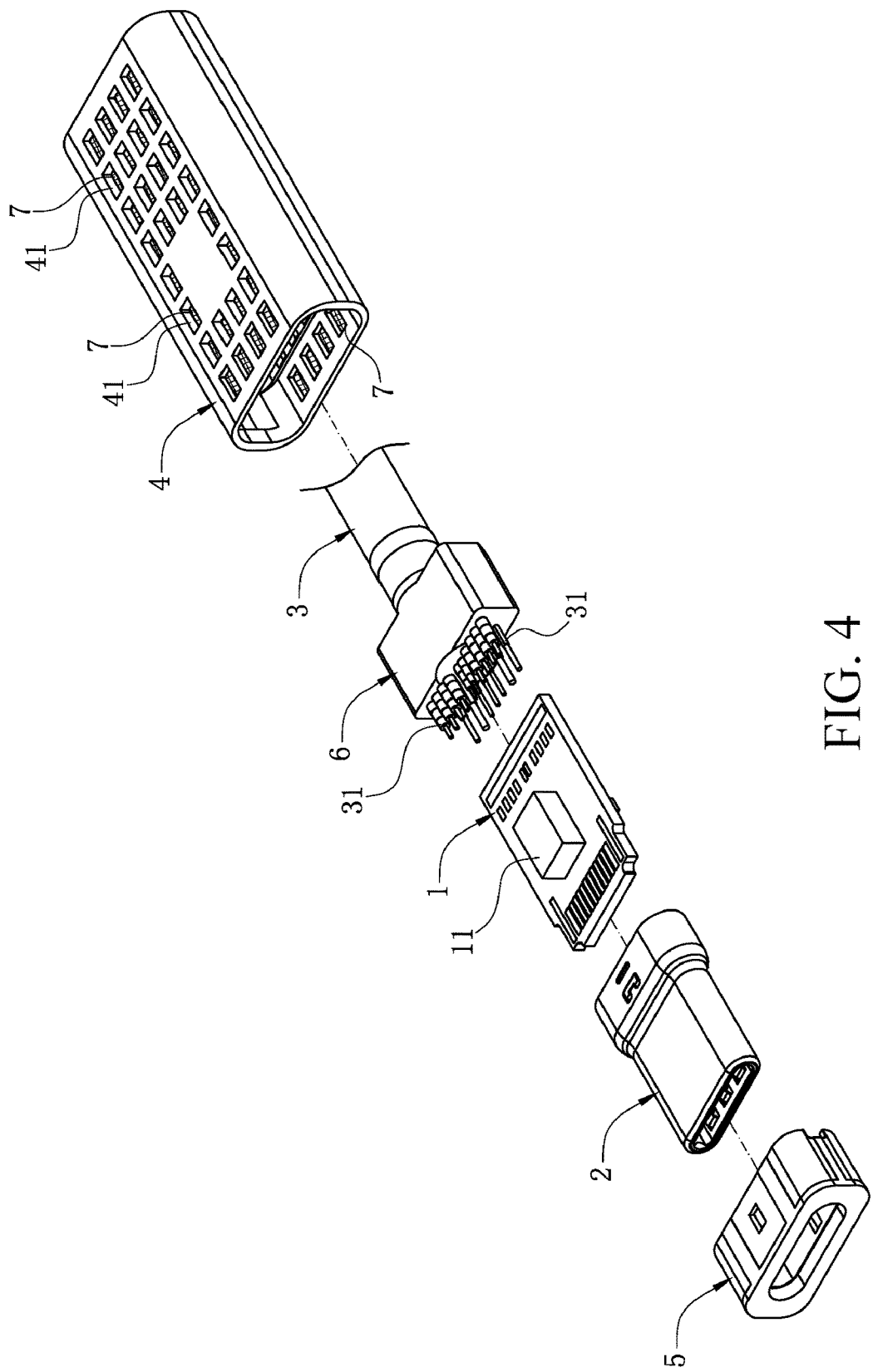
FIG. 4 is a perspective view of an electrical connector assembly in FIG. 3 being rotated for 180°.

As shown in FIG. 1, FIG. 3 and FIG. 4, during assembly, the electrical connector 2 and the core wire 31 of the cable 3 are soldered to two ends of the circuit board 1 respectively. Then the insulating member 5 is sleeved over the electrical connector 2. Finally, the metal shell 4 is sleeved over the cable 3, the circuit board 1 and the insulating member 5, such that the metal shell 4 is in contact with the chip 11 so as to complete assembly of the electrical connector 2.

Figure 8:
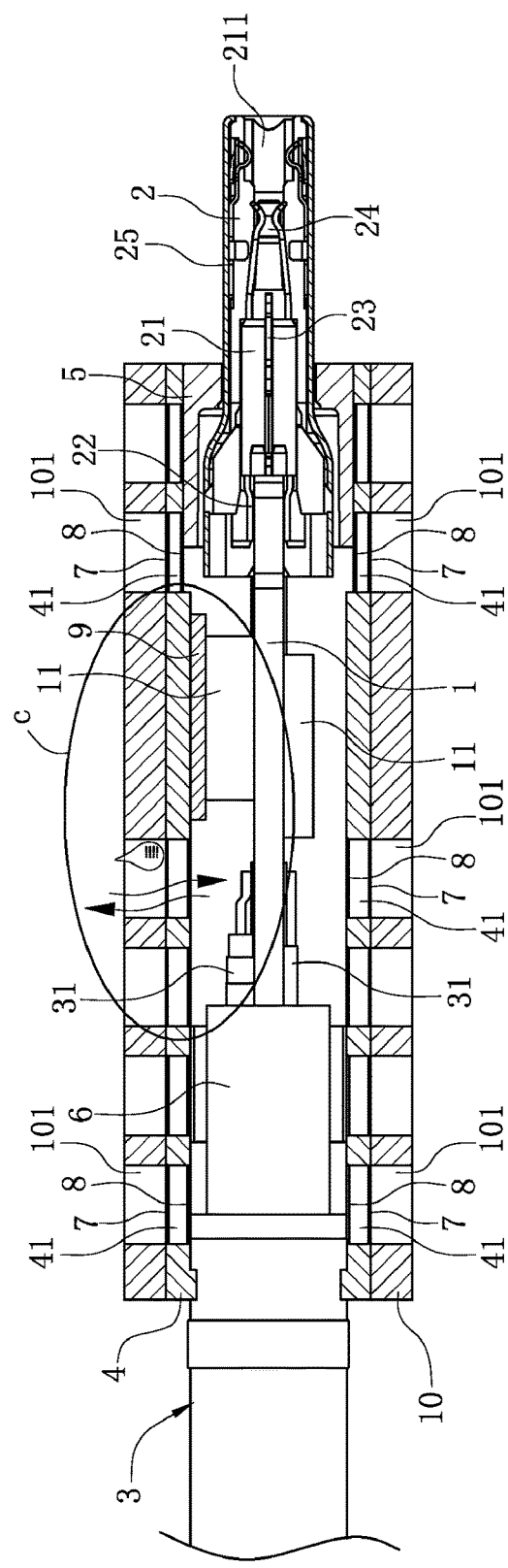
FIG. 8 is a sectional view of an electrical connector assembly according to a second embodiment of the present invention.
Figure 9:
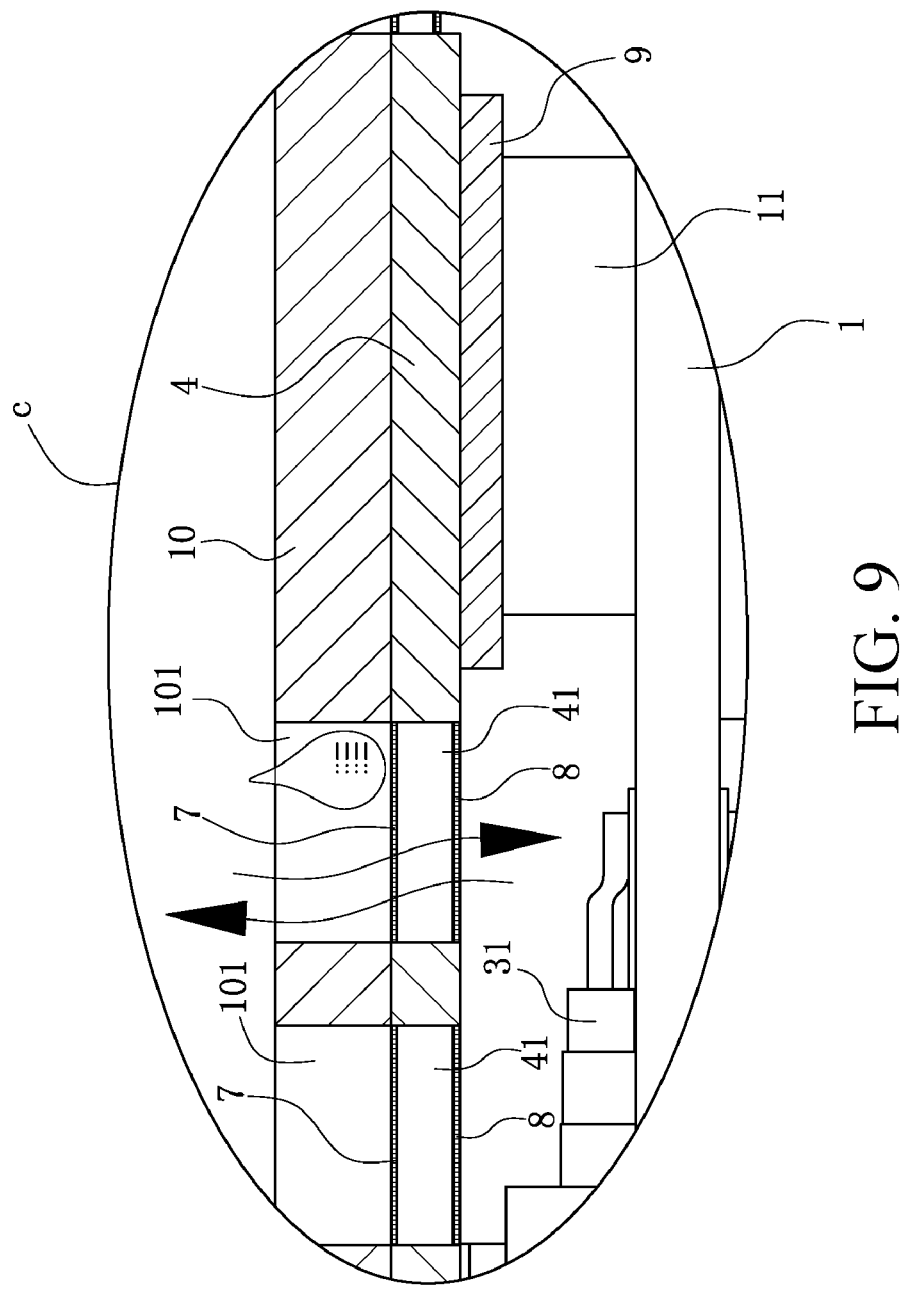
FIG. 9 is an enlarged view of a part c in FIG. 7.

As shown in FIG. 8 and FIG. 9, an electrical connector assembly 100 according to a second embodiment of the present invention is provided. In the present embodiment, the components marked with identical numerals to those in the first embodiment as shown in the drawings are not further elaborated herein. The difference between the electrical connector assembly 100 according to the first embodiment and the electrical connector assembly according to the second embodiment mainly exists in that, in the present embodiment, each through hole 41 is provided with a waterproof layer 7 and a shielding layer 8. The shielding layer 8 is a mesh structure made of a metal material. In other embodiments, the shielding layer 8 may also adopt a metal coating layer and is plated on the waterproof layer 7 in a chemical plating or electric plating manner. For example, the shielding layer can be made of silver-plated fiber fabrics. There are mainly two preparation methods for a silver-plated fiber: a method of plating a pure silver film on the surface of a textile fiber by using a high molecular material surface metallization technology to obtain a silver-plated fiber, and a method of adding superfine silver particles in a fiber molding process to obtain a nano-silver-plated fiber. The shielding layer 8 enables gas to pass between the interior and the exterior of the metal shell 4 and has the ability to resist electromagnetic interference.

The shielding layer 8 is located closer to the circuit board 1 than the waterproof layer 7. The waterproof layer 7 and the shielding layer 8 are disposed at two opposite ends of the through hole 41. In other embodiments, the waterproof layer 7 and the shielding layer 8 may be attached to each other and disposed at one end of the through hole 41.

A thermally conductive sheet 9 is provided between the metal shell 4 and the chip 11, and the chip 11 is thermally conducted with the metal shell 4 via the thermally conductive sheet 9.

In the present embodiment, the metal shell 4 is made of an aluminum alloy, and the thermally conductive sheet 9 is made of a thermally conductive silica gel sheet. The thermally conductive sheet 9 is in contact with the metal shell 4 and the chip 11 respectively. The thermal conductivity of the thermally conductive sheet 9 is greater than the thermal conductivity of the metal shell 4, and heat generated by the electrical connector 2 and the chip 11 may be quickly conducted to the metal shell 4 via the thermally conductive sheet 9, thereby avoiding influence on the performance of the chip 11 caused by accumulating of heat inside the metal shell 4, and avoiding influence on the performance of the electrical connector 2 caused by temperature increase of the electrical connector 2.

A plastic shell 10 covers the metal shell 4. The plastic shell 10 can prevent a user from directly touching the metal shell 4 when the metal shell 4 is hot, thereby enabling the user to conveniently use the electrical connector assembly 100.

The plastic shell 10 is provided with at least one opening 101 running therethrough at a position corresponding to the through holes 41 of the metal shell 4. The opening 101 runs through the plastic shell 10 in a vertical direction, and the opening 101 is used for dissipating heat generated by the electrical connector 2 and the chip 11 from the plastic shell 10.

In the present embodiment, there are multiple openings 101 provided on a top wall and a bottom wall of the plastic shell 10. In other embodiments, the opening 101 may also be provided with the waterproof layer 7 and the shielding layer 8, and there may be only one opening 101. The openings 101 are communicated with the through holes 41 respectively, and each opening 101 directly faces a corresponding through hole 41, such that the heat generated by the electrical connector 2 and the chip 11 can be fully dissipated out via the openings 101.

The difference between another embodiment and the second embodiment mainly exists in that the metal shell 4 may be replaced with a shell made of a plastic material, and the shielding layer 8 is electrically conductive to enhance the anti-electromagnetic interference capability of the shell. On the basis of the present embodiment, the shell may be provided not to be covered by the plastic shell 10, such that the shell is located on the outermost side of the connector assembly 100.

To sum up, the electrical connector assembly according to certain embodiments of the present invention has the following beneficial effects.

(1) The metal shell 4 is provided with at least one through hole 41 running therethrough. Each through hole 41 is provided with the waterproof layer 7, and the waterproof layer 7 enables heat generated by the electrical connector 2 and the chip 11 to be dissipated to an external environment via the through hole 41 for heat exchange with the external air, so as to achieve heat dissipation. Moreover, the waterproof layer 7 prevents liquid in the external environment from entering the electrical connector 2 and the chip 11 via the through hole 41, thereby achieving water proofing, avoiding malfunctioning of the electrical connector 2 and the chip 11 due to excess temperature or liquid entry, ensuring the reliability of signal transmission between the electrical connector 2 and the chip 11, and prolonging the service lives of the electrical connector 2 and the chip 11.

(2) Each through hole 41 is also provided with the shielding layer 8, and the shielding layer 8 has a heat dissipation function, thereby avoiding malfunctioning of the electrical connector 2 and the chip 11 due to excess temperature. Moreover, the shielding layer 8 has the ability to resist electromagnetic interference, thereby enhancing the shielding effect of the metal shell 4 for the electrical connector 2, the circuit board 1 and the chip 11, ensuring the reliability of signal transmission between the electrical connector 2 and the chip 11, and prolonging the service lives of the electrical connector 2 and the chip 11.

(3) The waterproof layer 7 is disposed at an end of the through hole 41 close to the circuit board 1, so that the waterproof layer 7 can be prevented from being damaged due to exposure in the external environment, thereby prolonging the service life of the waterproof layer 7.

(4) The shielding layer 8 is located closer to the circuit board 1 than the waterproof layer 7. The waterproof layer 7 can prevent the shielding layer 8 from being damaged by entry of liquid in the external environment, thereby prolonging the service life of the shielding layer 8.

(5) None of the through hole 41 is provided on the metal shell 4 at a position right above the chip 11, such that a full contact area is provided between the chip 11 and the metal shell 4, thereby further dissipating heat generated by the chip 11 from the metal shell 4.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An electrical connector assembly, comprising:
    a circuit board, provided with at least one chip;
    an electrical connector, electrically connected to one end of the circuit board, and configured to be mated with a mating connector; and
    a metal shell, covering the circuit board and the electrical connector, wherein the metal shell is provided with at least one through hole running therethrough, and each of the at least one through hole is provided with a waterproof layer preventing liquid from passing from an exterior of the metal shell to an interior of the metal shell and enabling gas to pass between the interior and the exterior of the metal shell.

2. The electrical connector assembly of claim 1, wherein the waterproof layer is a mesh structure made of a Gore-Tex material.

3. The electrical connector assembly of claim 1, wherein the waterproof layer is provided at an end of each of the at least one through hole close to the circuit board.

4. The electrical connector assembly of claim 1, wherein a shielding layer is plated on the waterproof layer, and the shielding layer enables the gas to pass between the interior and the exterior of the metal shell.

5. The electrical connector assembly of claim 1, wherein none of the at least one through hole is provided on the metal shell at a position right above each of the at least one chip.

6. The electrical connector assembly of claim 5, wherein a thermally conductive sheet is provided between the metal shell and the at least one chip, and the at least one chip is thermally conducted with the metal shell via the thermally conductive sheet.

7. The electrical connector assembly of claim 1, wherein the metal shell is provided with one of the at least one through hole at a position right above the electrical connector.

8. The electrical connector assembly of claim 7, wherein an insulating member is sleeved over a side of the electrical connector close to the circuit board, the metal shell covers the insulating member, and the one of the at least one through hole is provided at a position of the metal shell right above the insulating member.

9. The electrical connector assembly of claim 1, wherein a plastic shell covers the metal shell, the plastic shell is provided with at least one opening running therethrough at a position corresponding to the at least one through hole of the metal shell, and the at least one opening is communicated with the at least one through hole.

10. The electrical connector assembly of claim 1, wherein a cable is provided with a plurality of core wires soldered to an opposite end of the circuit board, an injection-molded member covers the core wires, and the metal shell is provided with one of the at least one through hole at a position right above the injection-molded member.

11. An electrical connector assembly, comprising:
    a circuit board, provided with at least one chip;
    an electrical connector, electrically connected to one end of the circuit board, and configured to be mated with a mating connector; and
    a metal shell, covering the circuit board and the electrical connector, wherein the metal shell is provided with at least one through hole running therethrough, each of the at least one through hole is provided with a waterproof layer and a shielding layer, the waterproof layer prevents liquid from passing from an exterior of the metal shell to an interior of the metal shell and enables gas to pass between the interior and the exterior of the metal shell, and the shielding layer enables the gas to pass between the interior and the exterior of the metal shell.

12. The electrical connector assembly of claim 11, wherein the waterproof layer is a mesh structure made of a Gore-Tex material.

13. The electrical connector assembly of claim 11, wherein the shielding layer is a mesh structure made of a metal material.

14. The electrical connector assembly of claim 11, wherein the shielding layer is located closer to the circuit board than the waterproof layer.

15. The electrical connector assembly of claim 11, wherein none of the at least one through hole is provided on the metal shell at a position right above each of the at least one chip.

16. The electrical connector assembly of claim 15, wherein a thermally conductive sheet is provided between the metal shell and the at least one chip, and the at least one chip is thermally conducted with the metal shell via the thermally conductive sheet.

17. The electrical connector assembly of claim 11, wherein the metal shell is provided with one of the at least one through hole at a position right above the electrical connector.

18. The electrical connector assembly of claim 17, wherein an insulating member is sleeved over a side of the electrical connector close to the circuit board, the metal shell covers the insulating member, and the one of the at least one through hole is provided at a position of the metal shell right above the insulating member.

19. The electrical connector assembly of claim 11, wherein a plastic shell covers the metal shell, the plastic shell is provided with at least one opening running therethrough at a position corresponding to the at least one through hole of the metal shell, and the at least one opening is communicated with the at least one through hole.

20. The electrical connector assembly of claim 11, wherein a cable is provided with a plurality of core wires soldered to an opposite end of the circuit board, an injection-molded member covers the core wires, and the metal shell is provided with one of the at least one through hole at a position right above the injection-molded member.

21. A shell, provided with at least one through hole running therethrough, wherein each of the at least one through hole is provided with a waterproof layer, and one side of the waterproof layer is provided with a shielding layer being electrically conductive, wherein the waterproof layer prevents liquid from passing from an exterior of the shell to an interior of the shell and enables gas to pass between the interior and the exterior of the shell, and the shielding layer enables the gas to pass between the interior and the exterior of the shell.

\* \* \* \* \*